United States Patent [19]

Dimigen et al.

[11] Patent Number: 4,828,728
[45] Date of Patent: May 9, 1989

[54] DRY LUBRICATED BEARING

[75] Inventors: Heinz Dimigen; Hubertus Hübsch, both of Hamburg, Fed. Rep. of Germany

[73] Assignee: U.S. Philips Corporation, New York, N.Y.

[21] Appl. No.: 593,783

[22] Filed: Mar. 27, 1984

Related U.S. Application Data

[63] Continuation of Ser. No. 433,927, Oct. 12, 1982, abandoned, which is a continuation of Ser. No. 162,974, Jun. 25, 1980, abandoned.

[30] Foreign Application Priority Data

Jun. 28, 1979 [DE] Fed. Rep. of Germany ....... 2926080

[51] Int. Cl.$^4$ .............................................. F16C 33/12
[52] U.S. Cl. ..................................... 252/12; 252/12.2
[58] Field of Search ................................. 252/12, 12.2

[56] References Cited

U.S. PATENT DOCUMENTS

| | | | |
|---|---|---|---|
| 3,675,980 | 7/1972 | Stiff et al. | 384/298 |
| 4,084,863 | 4/1978 | Capelli | 308/238 |
| 4,260,203 | 4/1981 | Gainer | 308/8.2 |

Primary Examiner—Jacqueline V. Howard
Attorney, Agent, or Firm—Brian J. Wieghaus

[57] ABSTRACT

Layers of carbon with a thickness ranging from 10 nm to 10 μm with a diamond-like crystalline structure in a vacuum under a protective atmosphere, but also in atmospheric conditions, represent an excellent dry lubricant which is characterized by a very low coefficient of sliding friction ($\mu \cong 0.01$ to $0.1$) and also by a very high abrasion resistance.

The adhesion of the carbon layer to bearing surfaces can be improved by an intermediate layer between the lubricating layer and the bearing surface. The intermediate layer preferably has a lattice structure similar to that of the lubricating layer.

4 Claims, 1 Drawing Sheet

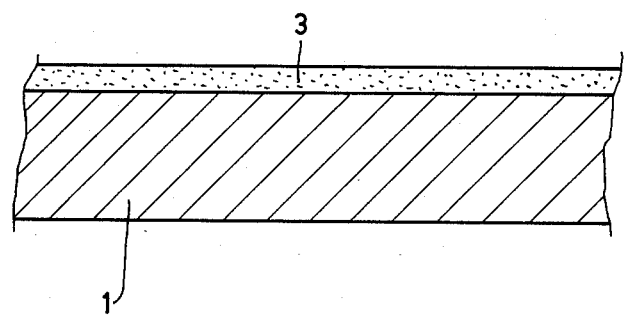

DRY LUBRICATED BEARING

This is a continuation of application Ser. No. 433,927, filed Oct. 12, 1982; which is a continuation of Ser. No. 162,974 filed June 25, 1980 both now abandoned.

BACKGROUND OF THE INVENTION

The invention concerns a dry-lubricated bearing with a sliding layer containing carbon between the bearing surfaces.

Bearings serve as support (guidance) of the moving parts of a machine inside stationary parts. Such bearings are used, for example, in rotary X-ray anodes.

In order to reduce the frictional resistance between bearing surfaces, lubricants are applied which reduce the wear and tear on the material and also the energy consumption.

In the friction between bearing surfaces, the frictional or tangential force K is dependent on the coefficient of friction $\mu$ between the bearing surfaces and on the load P with which the surfaces rub on or against one another: $K = \mu \cdot P$.

A bearing surface means the surface of a component which bears against the surface of another component when there is a certain contact force exerted on one component by the other component.

The coefficient of friction $\mu$ is dependent on the surface roughness of the bearing surfaces, but in the case of smooth surfaces on the pairing of materials, i.e. on the materials of the opposed bearing surfaces. It is known how to change the coefficient of friction of dry rubbing by covering the bearing surfaces with other kinds of substances in order to reduce the friction and to reduce the wear of the bearing surfaces.

On account of their material properties, the known dry lubricants can be split up into different groups:
1. substances which have good sliding friction properties because of a plate-like crystalline structure, such as graphite or even the chalcogenides of metals like molybdenum, tungsten and niobium;
2. malleable metals such as gold, silver, lead or tin;
3. hard substances such as silicides, borides, nitrides or carbides.

The substances mentioned can be placed loosely between the bearing surfaces or deposited as thin layers bonded to the bearing surface by means of a conventional thin film technology process, such as vapour deposition or cathode sputtering.

All these dry lubricants have their particular advantages and disadvantages.

A disadvantage peculiar to graphite as a dry lubricant is that while in normal atmospheric conditions it has a low sliding friction coefficient ($\mu \cong 0.1$–$0.2$), which is desirable, in a dry atmosphere it displays a much greater sliding friction coefficient ($\mu \cong 0.8$); the result of this is that there is considerable wear of the bearing surfaces on a dry atmosphere, since the graphite is very soft.

Friction problems at not very high temperatures can be solved effectively by using chalcogenides of the type mentioned above, but the use of these materials becomes problematical at high temperatures. $MoS_2$, for example, decomposes in air at temperatures above 400° C. This lack of thermal stability therefore limits the employment of materials which would otherwise be suitable as dry lubricants. In contrast to graphite, $MoS_2$ has a very low sliding friction coefficient ($\mu = 0.04$) in a dry atmosphere, while under normal atmospheric conditions the sliding friction coefficient $\mu$ rises to ~0.2.

A general disadvantage of materials with a plate-like structure—and this applies both to graphite and to $MoS_2$—is their insufficient abrasion resistance and relative softness.

Malleable metals such as gold, silver, lead and tin are good dry lubricants as these materials have a comparatively low sliding friction coefficient ($\mu \cong 0.2$–$0.4$). Since these metals are extremely soft, however,—which is what on the other hand gives them their good sliding properties—they also only have a low abrasion resistance.

In order to provide lubricating layers having a higher abrasion resistance, harder materials such as silicides, borides, nitrides and carbides have been used on bearing surfaces.

It has been shown that it is possible to achieve a good resistance to abrasion with these harder materials, but the sliding friction coefficients in these cases are, with values of $\mu \cong 0.3$ to 0.7, far above the values of the materials which are suitable as dry lubricants because of their low sliding friction coefficients, graphite ($\mu \cong 0.1$–$0.2$) or molybdenum sulfide $MoS_2$ ($\mu \cong 0.04$).

SUMMARY OF THE INVENTION

The object of the invention was to create a dry-lubricated bearing whose bearing surfaces have a sliding friction coefficient of the order of that of graphite or of molybdenum sulphide, but which also have a high abrasion resistance and hardness comparable to that of hard substances such as borides, silicides, nitrides and carbides.

This problem has been solved by the invention in that at least one of the bearing surfaces bears a lubricating layer which is a layer of carbon with diamond-like structure 10 nm to 10 $\mu$m thick bonded to the said bearing surface.

Surprisingly it has been shown that especially good sliding friction coefficients are not necessarily linked to a plate like structure of the dry lubricant, as had previously been assumed. The particularly good sliding friction properties of the materials with plate-like structure can be traced back, as is known, to the fact that the atomic spacings in the laminar plane are smaller than in the direction which is perpendicular to that plane. As the cohesion forces depend to a large extent on the atomic spacings (with increasing distance they fall in accordance with a power law), a lower friction coefficient is produced between the adjacent laminar planes than with the relatively great cohesion for example of most metals. Good sliding friction coefficients obviously depend on other, as yet undefined parameters, as is shown by the lubricating layer with diamond-like structure according to the invention.

In a preferred version of the invention an intermediate layer improving the adhesion of the lubricating layer to the bearing surface is disposed between the lubricating layer and the bearing surface and it preferably has a lattice structure similar to that of the lubricating layer.

The intermediate layer can consist of silicon or silicon dioxide. Associated with this is the advantage that the strength of the bond between the lubricating layer and the bearing surface can be improved considerably, particularly if the bearing surfaces consist of steel.

A preferred method for use in the production of the lubricating layer for the dry-lubricated bearing is one in which the lubricating layer is applied to the substrate to be coated in a plasma-activated deposition process from the gaseous phase (chemical vapour deposition) in such a way that an electrical bias voltage of up to some kV is imparted to the substrate and the gaseous atmosphere from which the lubricating layer is deposited contains gaseous hydrocarbons.

Acetylene is preferably used as the hydrocarbon.

The advantages gained from the invention are in particular that lubricating layers can be prepared which under vacuum or under inert gas conditions have an especially low sliding friction coefficient $\mu$ of the order of 0.01 to 0.02 at the same time as a very high abrasion resistance and hardness, which is of particular advantage when using the bearing according to the invention in rotary anode X-ray tubes.

Another advantage is that these layers also have sliding friction coefficients $\mu$ under normal atmospheric conditions (in air with a relative humidity of 50%) which are from 0.08 to 0.1 lower than those of the dry-lubricating substance $MoS_2$ which, under normal atmospheric conditions, is known to be the best for lubricating purposes with sliding friction coefficient values of $\mu$ of 0.1 to 0.2.

The lubricating layer according to the invention is especially suitable if at least one of the bearing surfaces, that is a bearing member, is steel. Since most lubricating problems occur in the field of steel surfaces, this is a preferred field of application for the lubricating layers in line with the invention.

BRIEF DESCRIPTION OF THE DRAWINGS

An example of the invention and how it works will now be explained with reference to the drawing, in which the sole FIGURE is part of a cross-section of a bearing surface coated with a lubricating layer in line with the invention.

DETAILED DESCRIPTION OF THE PREFERRED EMBODIMENT

A layer 3~1 $\mu$m of thick carbon of diamond-like structure was applied to a substrate 1 which was a silicon disc with a diameter of 50 mm and a thickness of 0.25 mm. The deposition took place from the gaseous phase in a way known in itself by means of a plasma-activated deposition process, in which a bias voltage of 100 V was imparted to the substrate 1. In this the substrate was located on an electrode in a conventional piece of high-vacuum equipment as is used for example for the HF cathode sputtering process. After evacuation down to the high vacuum range ($1.33 \times 10^{-3}$ Pa), the equipment was charged with the gases required for the deposition process. It is necessary to have carbon in the gaseous phase for the formation of the layer 3, but also energy has to be transferred by means of ions. A method of this sort is described in D. S. Whitmell et al: Thin Sol. Films, 35 (1976) 255.

It is in principle possible for the coating to be done with high-energy carbon ions, e.g. with a high energy molecular beam. For industrial purposes, however, it is more economical to use gases which on the one hand provide carbon after dissociation in the plasma and on the other high-energy ions. In this example acetylene at a partial pressure of about 130 Pa was used as the gas providing carbon. The agitation of the gas necessary for the deposition was brought about by applying a high-frequency voltage to the electrode bearing the substrate. The d.c. bias voltage on the substrate amounted to about 100 V.

The frictional properties and the hardness of the deposited carbon layers according to the invention are shown in the Table below in relation to the corresponding values of other known dry-lubricating substances. The sliding friction coefficients were derived by means of a pin on a disc.

| Lubricant | Hardness (N/mm$^2$) | sliding friction coefficients $\mu$ |
|---|---|---|
| graphite | $10^3$ | 0.1–0.2 (normal atmosphere, air with 50% relative humidity) |
| | | 0.6 (dry atmosphere) |
| chalcogenides $MoS_2$ | $10^3$ | 0.02–0.05 (dry atmosphere) |
| | | 0.2 (normal atmosphere, air with 50% relative humidity) |
| ductile metals, silver, lead, gold, tin indium | $10^3$–$3 \times 10^3$ | 0.2–0.4 under normal conditions |
| hard substances borides silicides nitrides carbides | $15 \times 10^3$–$35 \times 10^3$ | 0.03–0.4 |
| | | 0.3–0.8 under normal conditions |
| carbon layers according to the invention | $20 \times 10^3$–$35 \times 10^3$ | 0.01–0.02 (dry atmosphere) |
| | | 0.08–0.1 (normal atmosphere, air with 50% relative humidity |

The deposition of a lubricating layer according to the invention on a silicon substrate was described as an example.

To improve the adhesion of the lubricating layer to the substrate it may however be recommended that an intermediate layer should be applied between the substrate to be coated and the lubricating layer.

This intermediate layer can e.g. have a similar lattice structure to that of the sliding layer, although hard amorphous substances have proved to be suitable materials for the intermediate layer.

In experiments which led to the invention, silicon and silicon dioxide layers and also titanium oxycarbide layers with a layer thickness of 50 nm were applied to a steel substrate as intermediate layers. The coating can be done in accordance with a method known from thin-film technology, e.g. by cathode sputtering.

What is claimed is:

1. A dry-lubricated bearing having first and second bearing surfaces, at least one of said bearing surfaces including a lubricating layer which is a layer of carbon with a diamond-like structure, 10 nm to 10 $\mu$m thick, which is adhesively bonded to said one bearing surface by means of an intermediate layer, said intermediate layer having a lattice structure similar to that of the lubricating layer.

2. A dry-lubricated bearing as in claim 1, wherein the intermediate layer is a material selected from the group consisting of silicon and silicon dioxide.

3. A dry-lubricated bearing having first and second bearing surfaces, at least one of said bearing surfaces including a lubricating layer which is a layer of carbon with a diamond-like structure, 10 nm to 10 μm thick, which is adhesively bonded to said one bearing surface by means of an intermdiate layer, said intermediate layer having a lattice structure similar to that of the lubricating layer and a thickness in the range of 10 to 100 nm.

4. A dry-lubricated bearing having first and second bearing surfaces, at least one of said bearing surfaces including a lubricating layer which is a layer of carbon with a diamond-like structure, 10 nm to 10 μm thick, which is adhesively bonded to said one bearing surface by means of an intermediate layer, wherein the intermediate layer consists of a quasi-amorphous layer of titanium oxycarbide.

* * * * *